(12) United States Patent
Luyten et al.

(10) Patent No.: US 11,277,287 B2
(45) Date of Patent: Mar. 15, 2022

(54) PROCESSING AMPLITUDE MODULATION SIGNALS WITH NOISE ESTIMATION

(71) Applicant: NXP B.V., Eindhoven (NL)

(72) Inventors: Joris Louis L Luyten, Begijnendijk (BE); Christophe Marc Macours, Hodelge (BE); Temujin Gautama, Boutersem (BE)

(73) Assignee: NXP B.V., Eindhoven (NL)

( * ) Notice: Subject to any disclaimer, the term of this patent is extended or adjusted under 35 U.S.C. 154(b) by 0 days.

(21) Appl. No.: 16/835,110

(22) Filed: Mar. 30, 2020

(65) Prior Publication Data
US 2021/0306188 A1 Sep. 30, 2021

(51) Int. Cl.
| | |
|---|---|
| *H04W 4/00* | (2018.01) |
| *H04L 27/02* | (2006.01) |
| *H03C 1/06* | (2006.01) |
| *H04L 27/26* | (2006.01) |
| *H04L 27/36* | (2006.01) |

(52) U.S. Cl.
CPC .............. *H04L 27/02* (2013.01); *H03C 1/06* (2013.01); *H04L 27/2691* (2013.01); *H04L 27/362* (2013.01)

(58) Field of Classification Search
CPC ... H04L 27/02; H04L 27/362; H04L 27/2691; H03C 1/06
USPC ........................................................ 370/329
See application file for complete search history.

(56) References Cited

U.S. PATENT DOCUMENTS

| | | | |
|---|---|---|---|
| 10,812,119 B1 | 10/2020 | Ciacci et al. | |
| 2004/0165680 A1 | 8/2004 | Kroeger | |
| 2012/0236975 A1* | 9/2012 | Yamagishi | H03G 3/3068 375/346 |
| 2014/0119062 A1* | 5/2014 | Nishijima | H02M 3/335 363/21.02 |

FOREIGN PATENT DOCUMENTS

JP 2012-100154 A 5/2012

OTHER PUBLICATIONS

Yohiyuki Hattori, Tomohisa Harada, Toyota Central R&D Labs, Noise Suppression Method for an AM radio Receiver Using Digital Signal Processing, Sep. 5-9, 2016, p. 393-398 (Year: 2016).*

(Continued)

*Primary Examiner* — Tanmay K Shah

(57) ABSTRACT

In one example, a communications circuit processes an amplitude modulated signal by using a first circuit having signal paths to process an amplitude modulated signal as represented by an in-phase component and by a quadrature component, and by using a second circuit to discern random noise pulses from the quadrature component of the amplitude modulated signal. In response, the second circuit generates an estimate of overall noise representing the random noise pulses in the amplitude modulated signal. In the above and more specific examples, the random noise pulses may appear as pulses which overlap with, in terms of time and bandwidth of frequency spectrum, information of the amplitude modulated signal, and the first and second circuits may be part of an RF radio receiving the amplitude modulated signal from an antenna.

20 Claims, 3 Drawing Sheets

(56) References Cited

OTHER PUBLICATIONS

Noise Suppression Method for an AM Radio Receiver Using Digital Signal Processing, Proc. of the 2016 International Symposium on Electromagnetic Compatibility—EMC Europe 2016, Wroclaw, Poland, Sep. 5-9, 2016.
Multifunction AM/FM Noise Reduction, Fujitsu-Ten Tech. J., No. 5 (1992).
U.S. Appl. No. 16/445,924, filed Jun. 19, 2019, entitled: Systems and Methods Involving Interference Cancellation. The Examiner is referred to the copending patent prosecution of the common Applicant (no attachment).
Hattori, Y. et al. "Noise Suppression Method for an AM Radio Receiver Using Digital Signal Processing", IEEE Proc. of the 2016 International Symposium on Electromagnetic Compatibility—EMC Europe 2016, Wroclaw, Poland, pp. 393-398 (Sep. 5, 2016).

\* cited by examiner

PROCESSING AMPLITUDE MODULATION SIGNALS WITH NOISE ESTIMATION

OVERVIEW

Aspects of various embodiments are directed to circuits configured to process signals such as radio frequency (RF) signals involving signal modulation that includes amplitude modulation and with such signals being susceptible to relatively random noise.

Assessing noise in signals, particularly RF signals involving the filtering of such noise, has been the focus of many engineering developments. One of many categories involving such noise issues pertains to machinery such as engines and the like which interferes with systems having electrical communication circuits that rely on signal integrity. Industry equipment and vehicles of all types provide examples of such machinery. Consider electric machines such as electric trains, automobiles and other electric vehicles, which are getting more and more popular. In such systems, radio reception quality may degrade due to interferences generated by the electrical motor used to power the vehicles. This issue is particularly a concern for AM (amplitude modulation) radio, which is the only available radio medium in many large countries such as US, Japan, India and Australia.

Many previous efforts have been made to address such noise. Using such electric vehicle systems, again as an example, systems made use of a probe antenna suitably located in or beneath the vehicle to capture most of the electric-vehicle interference without capturing any of the desired radio signal. In such systems, the signal from the probe antenna signal may be subtracted from the regular radio antenna signal to obtain a noise-free AM reception output. Unfortunately, this solution can be costly in requiring a second antenna and a second tuner. Another approach relies on DSP algorithms to suppress pulses which may be generated as this electric-vehicle interference. Another algorithm has been developed to suppress pulse noise by using somewhat complex time-domain signal processing techniques. Such techniques may be effective in certain regards, such as for isolated pulses, but they may be less effective for high pulse densities as observed in connection with interference as may occur, for example, in electric vehicles. Yet other algorithms exploit aspects concerning properties involving demodulation of an AM signal superimposed with noise by using a low pass and/or band pass filters to detect the signal noise (e.g., at high and low levels) with circuitry to process the signal so that an output results which contains the AM radio signal and without the noise.

These and other noise-interference issues have presented challenges to efficiencies involving many AM circuits and circuit-based communications systems, for a variety of applications.

SUMMARY

Various example embodiments are directed to issues such as those addressed above and/or others which may become apparent from the following disclosure concerning circuits configured to process signals such as radio frequency (RF) signals and involving amplitude modulation on such signals which may be susceptible to relatively random noise including, for example, noise which is introduced at the receiving antenna, for example, an amplitude modulation (AM) antenna and may appear in the RF circuitry as pulses.

In a more specific example, aspects are directed to embodiments in which an apparatus (e.g., a system, circuit-based device such as a radio or chip set) includes two circuits. The first circuit converts an AM modulated signal into two signals consisting of the in-phase and quadrature components of the AM signal. The second circuit derives a representation of the noise in the AM signal from the generated quadrature signal. Next this representation is used to calculate an estimate of the noise parameters of the AM signal.

In another specific aspect and example, the estimate of the noise parameters is used as an input to a spectral subtraction circuit operating to remove the noise for further processing of the AM signal. In another more specific example, with the quadrature component being used to create a representation of noise, such subtraction is as to aid in filtering the AM signal to reduce the level of noise carried into the circuit with the AM signal.

The above discussion/summary is not intended to describe each embodiment or every implementation of the present disclosure. The figures and detailed description that follow also exemplify various embodiments.

BRIEF DESCRIPTION OF FIGURES

Various example embodiments may be more completely understood in consideration of the following detailed description in connection with the accompanying drawings, in which.

Figure 1:
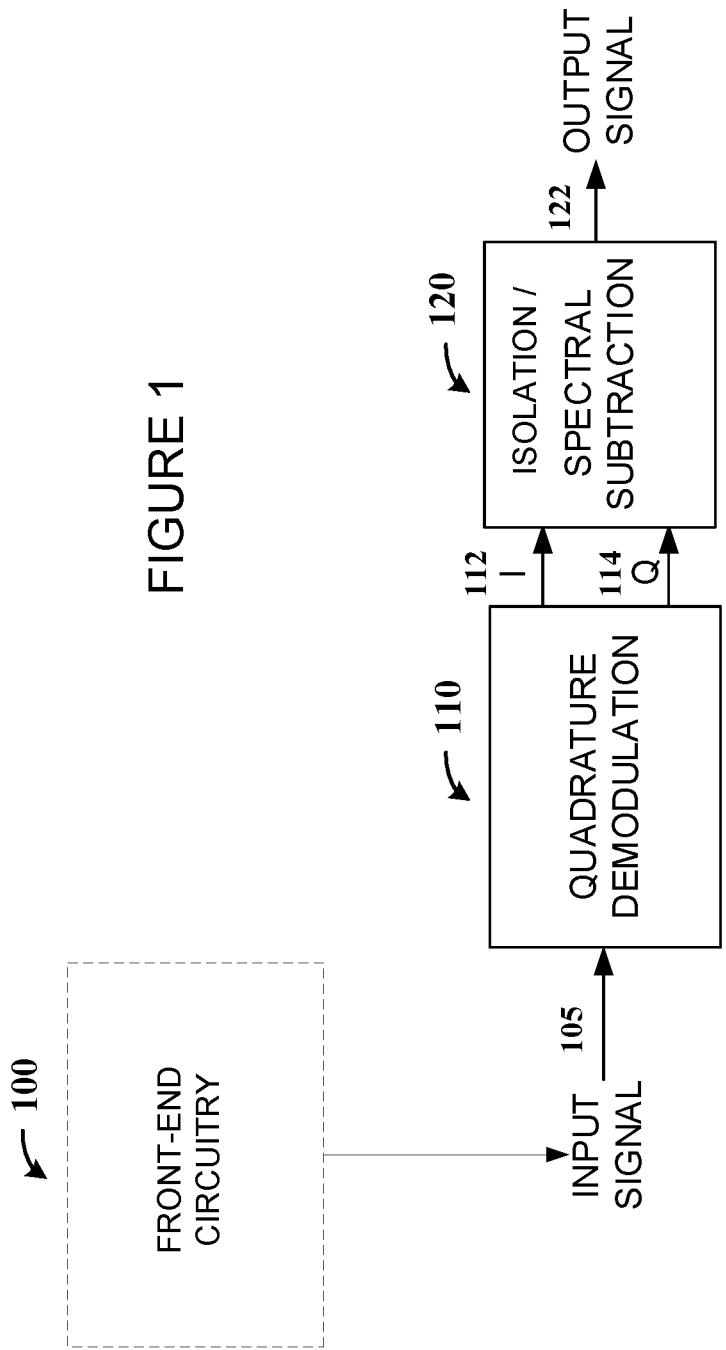
FIG. 1 is a block diagram illustrating an example communications circuit for processing AM signals, in accordance with the present disclosure.

While various embodiments discussed herein are amenable to modifications and alternative forms, aspects thereof have been shown by way of example in the drawings and will be described in detail. It should be understood, however, that the intention is not to limit the disclosure to the particular embodiments described. On the contrary, the intention is to cover all modifications, equivalents, and alternatives falling within the scope of the disclosure including aspects defined in the claims. In addition, the term "example" as used throughout this application is only by way of illustration, and not limitation.

DETAILED DESCRIPTION

Aspects of the present disclosure are believed to be applicable to a variety of different types of apparatuses, systems and methods involving circuits configured to process signals such as radio frequency (RF) signals and involving amplitude modulation on such signals which may be susceptible to relatively random noise. As certain examples associated with more-specific embodiments, aspects of the present disclosure involve AM radio frequency (RF) signals, as used in automobile radios which are susceptible to interference from the automobile engine. In examples where the automobile is an electric vehicle, such interference has been found to be particularly problematic in certain specific example embodiments in the below-discussed contexts. While not necessarily so limited, various aspects may be appreciated through the following discussion of non-limiting examples which use exemplary contexts.

Accordingly, in the following description various specific details are set forth to describe specific examples presented herein. It should be apparent to one skilled in the art, however, that one or more other examples and/or variations of these examples may be practiced without all the specific details given below. In other instances, well known features have not been described in detail so as not to obscure the description of the examples herein. For ease of illustration, the same reference numerals may be used in different diagrams to refer to the same elements or additional instances of the same element. Also, although aspects and features may in some cases be described in individual figures, it will be appreciated that features from one figure or embodiment can be combined with features of another figure or embodiment even though the combination is not explicitly shown or explicitly described as a combination.

According to one aspect of the disclosure, a method uses signal processing circuitry having a quadrature demodulator configured to process the digital samples input from a time domain input signal and process them for separating or outputting: (a) a set of digital samples representing the in-phase portion of the amplitude modulated signal, and (b) a set of digital samples representing the quadrature portion of the amplitude modulated signal. Once separated and/or output as such, another related aspect involves use of signal processing circuitry to isolate (or in some instances, isolate and then spectrally subtract) the quadrature portion for use in characterizing the noise. Once isolated, the circuitry may then process this quadrature portion by effecting a subtraction of noise as such noise is represented by the quadrature portion; as an example, noise (estimated from quadrature signal) may be subtracted from the in-phase signal. In this regard, the signal processing circuitry may use the in-phase and quadrature samples from the quadrature demodulator as inputs.

In a more detailed example using the above aspects, the isolation/spectral subtraction signal processing circuitry may (a) estimate the noise spectrum from the quadrature component input, (b) extract the magnitude spectrum from the in-phase component input, and (c) subtract a scaled version of the noise spectrum estimate from the magnitude spectrum of the in-phase component input. This new magnitude spectrum may also be converted to time domain by combining it with the original in-phase phase information before converting this combined data using an IFFT (inverse fast-Fourier transform).

In another specific example, embodiments are directed to an apparatus such as an AM receiver or AM communications system. The apparatus includes front-end circuitry (in some instances including a radio antenna) which receives the AM signals as well as the interfering noise pulses which overlap with, in terms of time and bandwidth of frequency spectrum, information of the amplitude modulated signal. The antenna is connected to circuitry which separates out received signal for the desired bandwidth for conversion to a continuous stream of digital data. This may be accomplished, for example, using an analog-to-digital converter.

In a more-specific example, such an embodiment may include a first circuit to process the stream of digital data and separates it into two components; the in-phase component and the quadrature component. The embodiment may further include a signal processing circuit to use the quadrature component and the in-phase component, by filtering to reduce the overall noise and, in response, by producing a demodulated noise-filtered signal corresponding to the amplitude modulated signal. In one implementation consistent with this specific example, the amplitude modulated signal may be a modulated radio-frequency signal having at least one radio-frequency (RF) carrier frequency that has the amplitude modulated signal as at least a dominant modulation contributor for representing information carried by the RF carrier frequency.

Turning now to the drawing, FIG. 1 is a system-level block diagram illustrating a specific example of a circuit configured in accordance with aspects of the present disclosure. The block diagram may be applicable, for example, to an AM signal transmitted via an AM radio broadcast system or via another wireless system conveying information by AM signals, with other aspects of the radio-signal receiver now shown. Using AM radio broadcasting as an example, FIG. 1 may correspond to a block diagram of portion of an AM channel receiver showing a RF front-end circuit 100 for presenting the received signal 105 to circuitry 110 which is shown as including RF quadrature demodulator circuitry. The quadrature demodulator circuitry 110 is configured to separate the incoming signal and to create an output of two sets of signals, the in-phase data signal 112 and the quadrature data signal 114. These signals 112 and 114 are then processed by an isolation/spectral subtraction circuit 120. The isolation/spectral subtraction circuit 120 is configured to remove unwanted noise pulses from the signals 112 and deliver an output signal 122 which, in turn, may be further processed in downstream circuitry (not shown in FIG. 1) as may be typical with many AM receivers.

Figure 2:
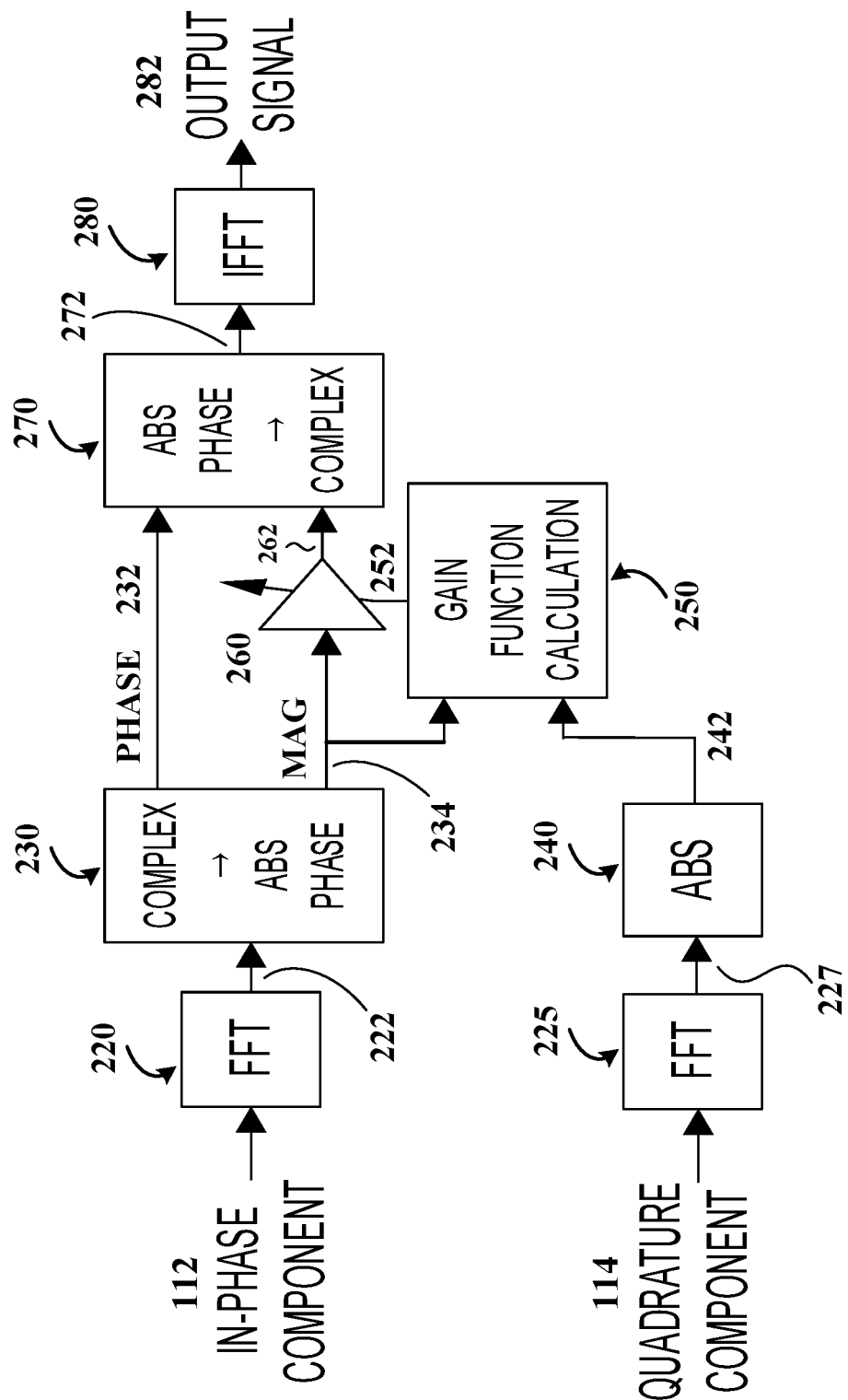
FIG. 2 is another block diagram illustrating an example way of implementing aspects discussed with FIG. 1, also in accordance with the present disclosure.

FIG. 2 shows an example of the isolation/spectral subtraction circuit. In this example, an in-phase component signal 112 is presented to an FFT (fast-Fourier transform) circuit 220 which converts or transforms the signal 112 from a time domain representation to a frequency domain representation with the output signal of the FFT circuit depicted at 222. The resolution and bandwidth of the frequency domain representation is dependent on the sample rate of the time domain data 112. This in-phase frequency domain signal 222 is then used as an input to the complex to magnitude and phase separator 230. This circuit takes the in-phase frequency domain representation signal 222 and extracts two components: (a) the in-phase frequency spectrum representation of the phase 232, and (b) the in-phase frequency spectrum representation of the magnitude 234 of the incoming signal. Further, the quadrature component signal 114 is presented to an FFT circuit 225 which converts the signal from a time domain representation to a frequency domain representation signal 227. The resolution and bandwidth of the frequency domain representation is dependent on the sample rate of the time domain data 114. This quadrature frequency domain signal 227 is then used as an input to the magnitude converter 240 (which may be implemented via an "ABS" converter as illustrated to provide an output having a magnitude corresponding to the absolute value of the input). This circuit takes the quadrature frequency domain representation signal 227 and extracts the frequency spectrum representation of the magnitude of the incoming signal. The magnitude spectrum of the in-phase signal 234 and the magnitude spectrum of the quadrature signal 242 are then passed to the gain function calculation circuit 250, which is configured to calculate a gain for each bin of the frequency domain signals based on the ratio of the magnitudes of the two signal inputs to this circuit. In a more specific example, the circuit 250 calculates the gain for each bin by subtracting the magnitude spectrum of the quadrature signal from the magnitude spectrum of the in-phase signal and dividing by the magnitude spectrum of the in-phase signal.

From the circuit 250, an output signal at 252 is used as an input to a gain adjust circuit 260. The gain adjust circuit 260 is configured to process as inputs, the in-phase magnitude spectrum 234 and the output signal 252 and adjust each bin of the in-phase frequency spectrum with a unique calculated gain. By this process the unwanted pulse noise is reduced in the spectrum. The gain adjusted spectrum 262 is then passed to the magnitude and phase combiner which combines the in-phase frequency spectrum representation of the phase 232 and the gain adjusted magnitude spectrum 262. This combined signal 272 is then passed to a IFFT 280 which converts this frequency domain signal to back to time domain 282 for further processing as may be typical in an AM receiver.

Figure 3:
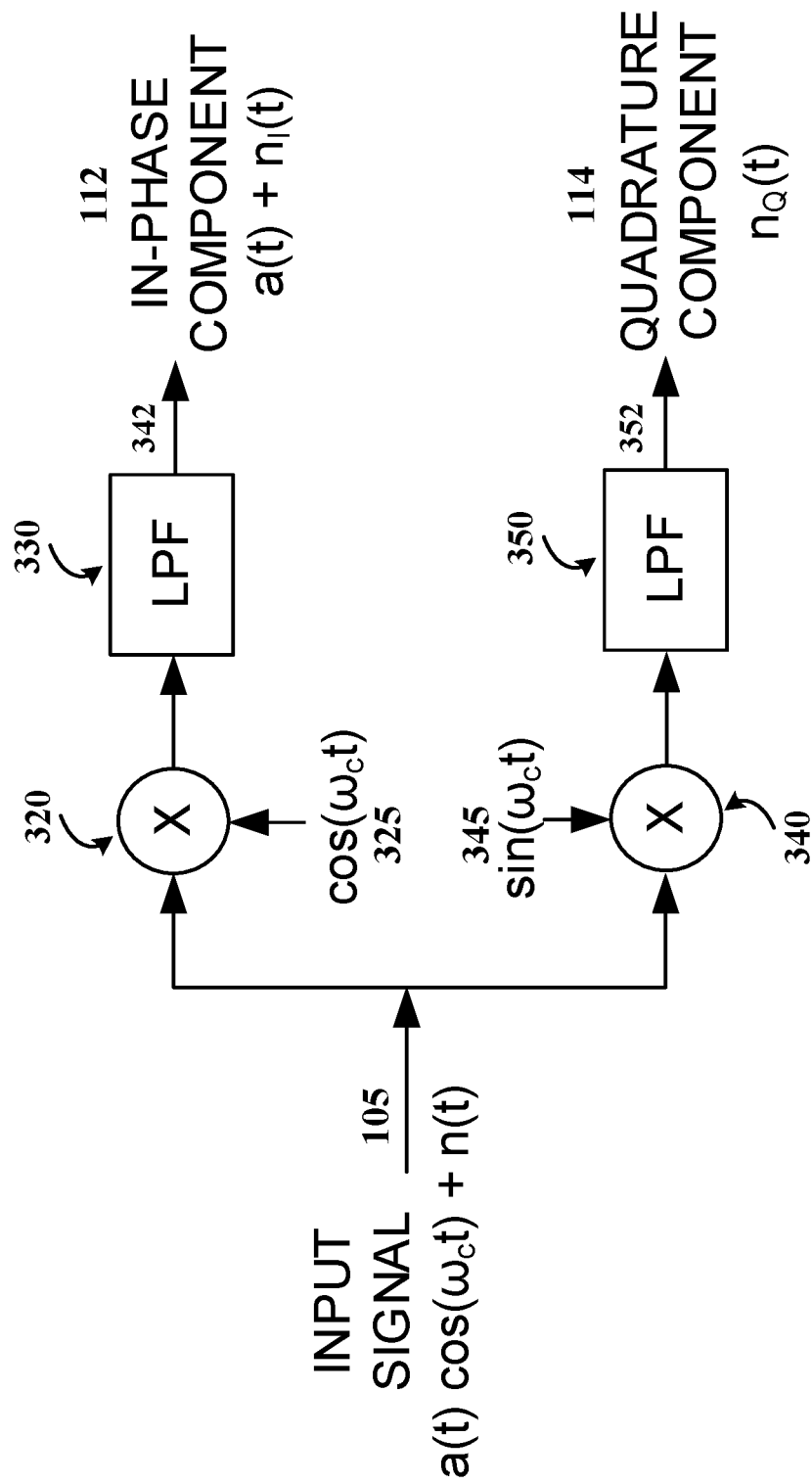
FIG. 3 is another block diagram illustrating another example way of implementing aspects discussed with FIG. 1, also in accordance with the present disclosure.

Turning now to FIG. 3, which shows an example of a quadrature demodulator 110. The input signal feeds two similar circuit paths respectively including multiplier 320 and multiplier 340. The first path is multiplied by a generated cosine wave (signal) 325 having an amplitude of one and a carrier frequency of the desired AM station as appropriate to reduce the frequency range of the incoming signals to the baseband frequency range. After being processed by a multiplier 320, an output signal is then passed to a low pass filter 330 to remove the upper signal image created by the signal multiplication. The output of the low pass filter 342 corresponds to the in-phase component representation of the input signal 105. Similarly, in the second path, the multiplier 340 combines the input signal 105 and a generated sine wave (signal) 345 having an amplitude of one and a frequency which is the same frequency as the frequency of the cosine signal as for reducing the frequency range of the incoming signals to the baseband range. From the multiplier 340, an output signal is passed to a low pass filter 350 to remove the upper signal image created by the signal multiplication. The output of the low pass filter 352 corresponds to the quadrature component representation of the input signal 105.

As another example, an RF receiver system in accordance with aspects of the present disclosure may mitigate such (pulse) noise in connection with AM communications. The RF receiver system may be of various types such as an analog-based circuit as in AM radio and/or a device having a digital circuit as commonly used in simple electronic toys. For such AM communications, the noise in the band of interest may be estimated from the quadrature component of the incoming, noise corrupted AM signal. These corrupting noise pulses may overlap the band of interest both in time and in frequency, making it hard to successfully receive the intended signal modulated on the transmission. As an optional aspect of such an exemplary system, the first circuit may be configured to separate the in-phase and quadrature signal and, then using the quadrature signal, for example, parameters of the quadrature signal are measured to estimate the noise. Next from this estimate the second circuit can convert the estimate to a spectral gain function. This spectral gain function can then be applied spectrally to the in-phase signal, producing a noise mitigated output signal.

The skilled artisan would recognize that various terminology as used in the Specification (including claims) connote a plain meaning in the art unless otherwise indicated. As examples, the Specification describes and/or illustrates aspects useful for implementing the claimed disclosure by way of various circuits or circuitry which may be illustrated as or using terms such as blocks, modules, device, system, unit, controller, and/or other circuit-type depictions (e.g., reference numerals 110 and 120 of FIG. 1 depict such a block, module etc., as described herein). Such circuits or circuitry are used together with other elements to exemplify how certain embodiments may be carried out in the form or structures, steps, functions, operations, activities, etc. For example, in certain of the above-discussed embodiments, one or more modules are discrete logic circuits or programmable logic circuits configured and arranged for implementing these operations/activities, as may be carried out in the approaches shown in FIGS. 1, 2 and 3. In certain embodiments, such a programmable circuit is one or more computer circuits, including memory circuitry for storing and accessing a program to be executed as a set (or sets) of instructions (and/or to be used as configuration data to define how the programmable circuit is to perform), and an algorithm or process as described above is used by the programmable circuit to perform the related steps, functions, operations, activities, etc. Depending on the application, the instructions (and/or configuration data) can be configured for implementation in logic circuitry, with the instructions (whether characterized in the form of object code, firmware or software) stored in and accessible from a memory (circuit). As another example, where the Specification may make reference to a "first [type of structure]", a "second [type of structure]", etc., where the [type of structure] might be replaced with terms such as ["circuit", "circuitry" and others], the adjectives "first" and "second" are not used to connote any description of the structure or to provide any substantive meaning; rather, such adjectives are merely used for English-language antecedence to differentiate one such similarly-named structure from another similarly-named structure (e.g., "first circuit configured to convert . . . " is interpreted as "circuit configured to convert . . . ").

Based upon the above discussion and illustrations, those skilled in the art will readily recognize that various modifications and changes may be made to the various embodiments without strictly following the exemplary embodiments and applications illustrated and described herein. For example, methods as exemplified in the illustrations may involve steps carried out in various orders, with one or more aspects of the embodiments herein retained, or may involve fewer or more steps. For instance, in FIG. 2 the gain function calculation 250 may be combined with the variable gain 260 to improve algorithm efficiency. As another example, in FIG. 2 the FFTs could be replaced by DFTs, or the IFFT may be replaced by an inverse DFT. Such modifications do not depart from the true spirit and scope of various aspects of the disclosure, including aspects set forth in the claims.

What is claimed is:

1. An apparatus comprising:
   a first circuit having signal paths to process an amplitude modulated (AM) signal as represented by an in-phase component and by an out-of-phase or quadrature component; and
   a second circuit to discern random noise pulses from the quadrature component of the AM signal and, in response, to generate an estimate of overall noise representing the random noise pulses in the AM signal, and to apply a gain function based on the estimate for producing a noise mitigated output signal, wherein the gain function is based on or derived from calculated gains associated with bins used to characterize one or more aspects of the AM signal.

2. The apparatus of claim 1, wherein during operation, the first circuit receives the random noise pulses as pulses which overlap with, in terms of time and bandwidth of frequency spectrum, information of the amplitude modulated signal.

3. The apparatus of claim 1, further including an RF radio having an antenna, wherein the first circuit is configured to receive the amplitude modulated signal from the antenna and is further configured to separate the amplitude modulated signal into the in-phase component and the out-of-phase or quadrature component.

4. The method of claim 1, further including as part of the first and second circuits:
a gain function calculation circuit to calculate a gain for the bins based on a ratio of the signal magnitudes in the signal paths; and
signal processing circuitry to (a) estimate the noise level of the quadrature component input, (b) extract the magnitude spectrum from the in-phase component input, and (c) use the noise spectrum estimate to subtract a scaled magnitude spectrum from the in-phase component input.

5. An apparatus comprising:
a first circuit having signal paths to process an amplitude modulated (AM) signal as represented by an in-phase component and by an out-of-phase or quadrature component;
a second circuit to discern random noise pulses from the quadrature component of the AM signal and, in response, to generate an estimate of overall noise representing the random noise pulses in the AM signal; and
a signal processing circuit to use the quadrature component by filtering the overall noise and in response, by producing a demodulated noise-filtered signal corresponding to the amplitude modulated signal, wherein the amplitude modulated signal is a modulated radio-frequency signal having at least one radio-frequency (RF) carrier frequency that has the amplitude modulated signal as at least a dominant modulation contributor for representing information carried by the RF carrier frequency.

6. An apparatus comprising:
a first circuit having signal paths to process an amplitude modulated (AM) signal as represented by an in-phase component and by an out-of-phase or quadrature component;
a second circuit to discern random noise pulses from the quadrature component of the AM signal and, in response, to generate an estimate of overall noise representing the random noise pulses in the AM signal; and
an RF radio having an antenna, wherein the first circuit is configured to receive the AM signal from the antenna and is further configured to separate the AM signal into the in-phase component and the out-of-phase or quadrature component, wherein during operation, the first circuit receives the random noise pulses via the antenna and as pulses which overlap with, in terms of time and bandwidth of frequency spectrum.

7. The apparatus of claim 1, further including an electrical communications system having a signal-receiving circuit for an appliance and wherein the first circuit and the second circuit are part of the signal-receiving circuit.

8. The apparatus of claim 1, further including a system having a signal receiving circuit and an electrical engine that in operation causes interference with the signal receiving circuit and causes the random noise pulses to appear as pulses which overlap with, in terms of time and bandwidth of frequency spectrum, corresponding to information of the amplitude modulated signal, and wherein the first circuit and the second circuit are part of the electrical communications system and the random noise pulses include harmonics of other noise.

9. The apparatus of claim 1, further including an electrical communications system having a signal-receiving circuit for a vehicle having an electrical engine that in operation causes interference with the signal-receiving circuit and causes the random noise pulses to appear as pulses which overlap with, in terms of time and bandwidth of frequency spectrum, corresponding to information of the amplitude modulated signal, and wherein the first circuit and the second circuit are part of the electrical communications system.

10. The apparatus of claim 1, further including an electrical communications system having a signal-receiving circuit for a stationary appliance engine having an electrical communications receiver that in operation causes interference with the signal-receiving circuit and causes the random noise pulses to appear as pulses which overlap with, in terms of time and bandwidth of frequency spectrum, corresponding to information of the amplitude modulated signal, and wherein the first circuit and the second circuit are part of the electrical communications receiver.

11. A method carried out by a circuit, the method comprising:
in a first circuit, processing an amplitude modulated (AM) signal in signal paths respectively representing the AM signal as an in-phase component and a quadrature component; and
in a second circuit, discerning random noise pulses from the quadrature component of the AM signal and, in response, generating an estimate of overall noise representing the random noise pulses in the amplitude modulated signal, and applying a gain function based on the estimate for producing a noise mitigated output signal, wherein the gain function is based on or derived from calculated gains associated with bins used to characterize one or more aspects of the AM signal.

12. The method of claim 11, wherein the first circuit receives the random noise pulses as pulses which overlap with, in terms of time and bandwidth of frequency spectrum, information of the amplitude modulated signal.

13. The method of claim 11, wherein the first circuit and the second circuit are part of an RF radio having an antenna, and wherein the first circuit receives the amplitude modulated signal from the antenna and separates the amplitude modulated signal into the in-phase component and the out-of-phase or quadrature component.

14. The method of claim 11, further including as part of the first and second circuits a gain function calculation circuit operating to calculate a gain for the bins based on a ratio of magnitude spectra in the signal paths.

15. A method carried out by a circuit, the method comprising:
in a first circuit, processing an amplitude modulated (AM) signal in signal paths respectively representing the AM signal as an in-phase component and a quadrature component;
in a second circuit, discerning random noise pulses from the quadrature component of the AM signal and, in response, generating an estimate of overall noise representing the random noise pulses in the amplitude modulated signal, and applying a gain function based on the estimate for producing a noise mitigated output signal, wherein the gain function is based on or derived from calculated gains associated with bins used to characterize one or more aspects of the AM signal; and
as part of the first and second circuits, signal processing circuitry operating to (a) estimate the noise level of the quadrature component input, (b) extract the magnitude spectrum from the in-phase component input, and (c)

use the noise spectrum estimate to subtract a scaled noise magnitude spectrum from the in-phase component input.

16. A method carried out by a circuit, the method comprising:

in a first circuit, processing an amplitude modulated (AM) signal in signal paths respectively representing the AM signal as an in-phase component and a quadrature component; and in a second circuit, discerning random noise pulses from the quadrature component of the AM signal and, in response, generating an estimate of overall noise representing the random noise pulses in the amplitude modulated signal, and applying a gain function based on the estimate for producing a noise mitigated output signal, wherein the gain function is based on or derived from calculated gains associated with bins used to characterize one or more aspects of the AM signal, wherein the first circuit and the second circuit are part of an RF radio having an antenna, wherein the first circuit receives the AM signal from the antenna and separates the amplitude modulated signal into the in-phase component and the out-of-phase or quadrature component, and the first circuit receives the random noise pulses via the antenna and as pulses which overlap with, in terms of time and bandwidth of frequency spectrum.

17. The method of claim 11, wherein the first circuit and the second circuit are part of an electrical communications system, wherein the electrical communications system has a signal-receiving circuit for an appliance which uses the amplitude modulated signal for operating the electrical communications system.

18. The method of claim 11, wherein an electrical engine causes interferences with the signal receiving circuit that includes the first circuit and the second circuit and causes the random noise pulses to appear as pulses which overlap with, in terms of time and bandwidth of frequency spectrum, corresponding to information of the amplitude modulated signal, and wherein the random noise pulses include harmonics of other noise.

19. The method of claim 11, wherein the first circuit and the second circuit are part of a signal processing circuit, and the signal processing circuit uses the quadrature component, as the estimate of overall noise in the amplitude modulated signal, by filtering the overall noise and in response, by producing a demodulated noise-filtered signal corresponding to the amplitude modulated signal.

20. The method of claim 11, wherein the amplitude modulated signal is a modulated radio-frequency signal having at least one radio-frequency (RF) carrier frequency that has the amplitude modulated signal as at least a dominant modulation contributor for representing information carried by the RF carrier frequency.

\* \* \* \* \*